United States Patent
Furlow

(10) Patent No.: US 8,015,641 B2
(45) Date of Patent: Sep. 13, 2011

(54) CUSHION AND METHOD FOR MANUFACTURING THE SAME

(75) Inventor: Gary Jay Furlow, Rome City, IN (US)

(73) Assignee: Arden Companies, Bingham Farms, MI (US)

( * ) Notice: Subject to any disclaimer, the term of this patent is extended or adjusted under 35 U.S.C. 154(b) by 0 days.

(21) Appl. No.: 12/829,100

(22) Filed: Jul. 1, 2010

(65) Prior Publication Data

US 2010/0269261 A1 Oct. 28, 2010

Related U.S. Application Data

(62) Division of application No. 11/563,778, filed on Nov. 28, 2006, now Pat. No. 7,770,248.

(51) Int. Cl.
*A47C 27/14* (2006.01)
(52) U.S. Cl. ..................... 5/653; 5/657; 5/632
(58) Field of Classification Search ....... 297/284.1–284, 297/219.1; 5/722–723, 657, 640, 632, 653
See application file for complete search history.

(56) References Cited

U.S. PATENT DOCUMENTS

| | | |
|---|---|---|
| 1,447,288 A | 3/1923 | Emmerich |
| 2,135,657 A | 11/1938 | Church |
| 2,667,915 A | 2/1954 | Pfeffer et al. |
| 3,044,517 A | 7/1962 | Levi |
| 3,109,474 A | 11/1963 | Levi |
| 3,346,298 A | 10/1967 | Champion |
| 3,761,131 A | 9/1973 | Oliver |
| 3,902,759 A | 9/1975 | Monteforte et al. |
| 4,116,148 A | 9/1978 | Torrez |
| 4,194,254 A | 3/1980 | Torrez |
| 4,242,767 A | 1/1981 | McMullen et al. |
| 4,843,662 A * | 7/1989 | Handelman ...................... 5/653 |
| 4,930,170 A | 6/1990 | Kobayashi et al. |
| 6,578,218 B2 | 6/2003 | Wassilefsky |
| 6,637,633 B1 | 10/2003 | Eberle |

OTHER PUBLICATIONS

Office Action dated Jun. 4, 2009 for U.S. Appl. No. 11/563,778.
Office Action dated Dec. 2, 2009 for U.S. Appl. No. 11/563,778.
Advisory Action dated Feb. 17, 2010 for U.S. Appl. No. 11/563,778.

* cited by examiner

*Primary Examiner* — Fredrick Conley
(74) *Attorney, Agent, or Firm* — Honigman Miller Schwartz and Cohn LLP

(57) ABSTRACT

A cushion unit includes shell having a first cushion retaining portion and a second cushion retaining portion that are demarcated by a hinge-seam including a fastener portion. The fastener portion is secured to an inboard surface of the shell. According to an embodiment, the cushion unit includes a cushion member affixed to an inboard surface of the shell. According to an embodiment, the fastener portion is secured directly to an outboard surface of the cushion member and secured indirectly to an inboard an inboard surface of the shell. According to an embodiment, the fastener portion is secured directly to an inboard an inboard surface of the shell. A method for manufacturing a cushion unit is disclosed. A method for providing a cushion unit is also disclosed.

10 Claims, 9 Drawing Sheets

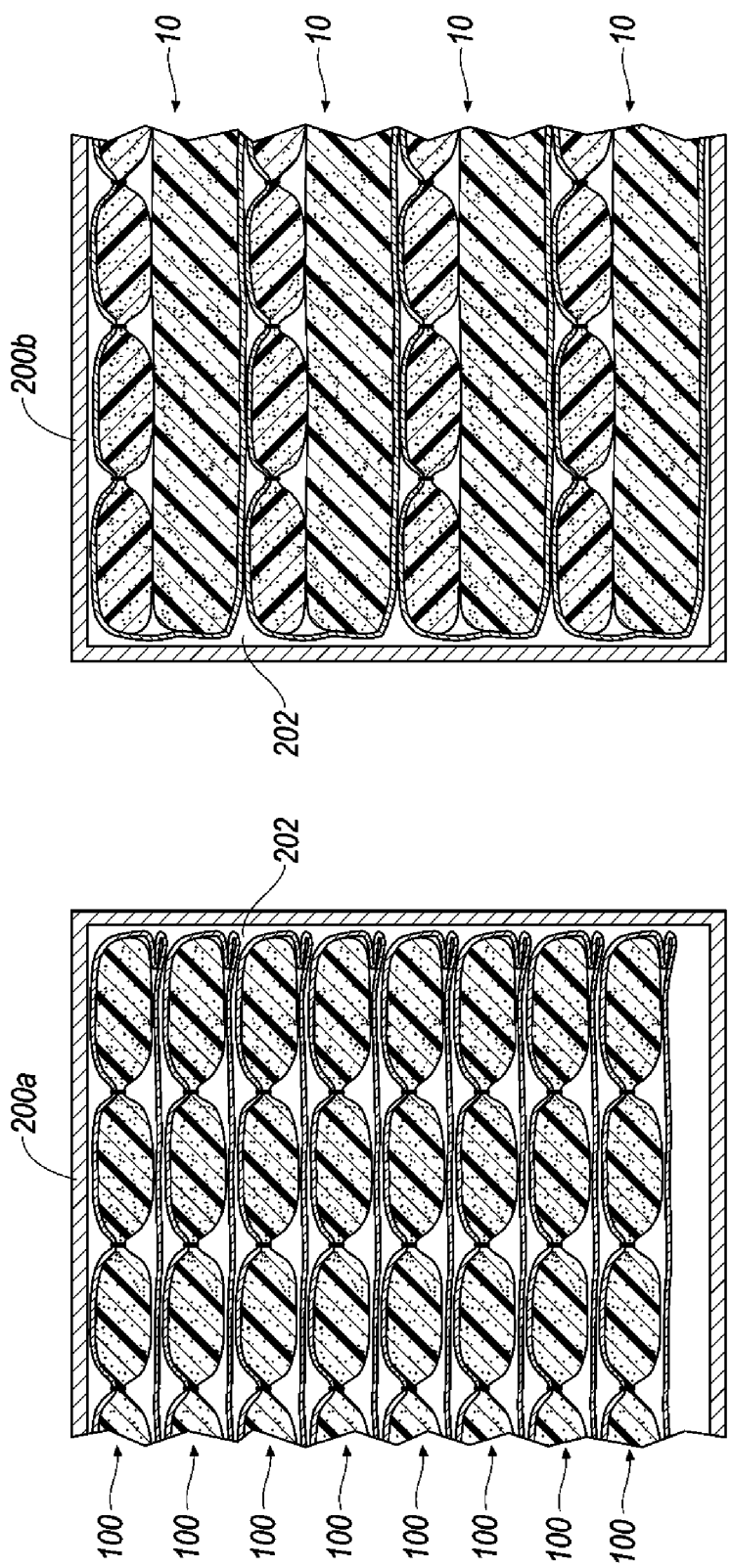

CUSHION AND METHOD FOR MANUFACTURING THE SAME

RELATED APPLICATION

This application is a divisional patent application of U.S. Ser. No. 11/563,778 filed on Nov. 28, 2006.

BACKGROUND

1. Technical Field

The invention relates to a cushion unit, a method for manufacturing a cushion unit, and a method for providing a cushion unit.

2. Description of Related Art

As is known in the art, cushions are commonly provided as a separate or integral component of an article of furniture so as to increase the comfort of a person, animal, or the like that is resting or seated upon the article of furniture. Conventional cushions typically include, for example, a shell of material that encloses a collection or unit of soft material, such as, for example, foam, feathers, or the like.

As is known in the art, conventional cushion manufacturing operations typically include a plurality of steps. One conventional cushion manufacturing operation may include the steps of (a) manufacturing a shell of material into a desired shape defining a cavity volume, (b) filling the cavity volume of the shell by stuffing a soft material through an opening formed in the shell, and (c) closing-off/sealing the opening formed in the shell by way of, for example, a sewing operation.

Although conventional cushions are known in the art, structural and ornamental design improvements are continuously sought after by cushion manufacturers. Such structural and/or ornamental improvements may provide cushion customers with a cushion product that is differentiated from conventional cushions that are available in the crowded cushion marketplace.

In addition, although conventional cushion manufacturing techniques are known in the art, global competitive forces demand that material costs, manufacturing costs, shipping costs, and the like are reduced so as to provide a cushion manufacturer with a profit. As such, although the manufacturing of a cushion unit may be conducted by a skilled laborer in a low-cost national country remote from a point-of-sale national country, there is a need in the art to provide a cushion structure that is conducive to providing an improvement over conventional cushion manufacturing techniques so as to maintain profitability or return greater profits to a cushion manufacturer while also maintaining an optimal design configuration of a cushion structure that is also aesthetically pleasing.

BRIEF DESCRIPTION OF THE DRAWINGS

The present disclosure will now be described, by way of example, with reference to the accompanying drawings, in which:

FIG. 6A illustrates a method for moving/shipping a plurality of cushion units in a container in accordance with an exemplary embodiment of the invention;

FIG. 6B illustrates a method for moving/shipping a plurality of cushion units in a container in accordance with an exemplary embodiment of the invention.

DETAILED DESCRIPTION

The Figures illustrate an exemplary embodiment of a cushion unit 10 and a partially-assembled cushion unit 100 in accordance with an embodiment of the invention. For brevity, the disclosure hereof will illustrate and describe a cushion unit 10 and a partially-assembled cushion unit 100 that includes one or more selectively-accessible opening(s) 54a, 54b that is/are disposed proximate and along a hinge or seam 38 (i.e., a non-edge surface) of the cushion unit 10/partially-assembled cushion unit 100. Based on the foregoing, it is to be generally understood that the nomenclature used herein is simply for convenience and the terms used to describe the invention should be given the broadest meaning by one of ordinary skill in the art.

Figure 1:
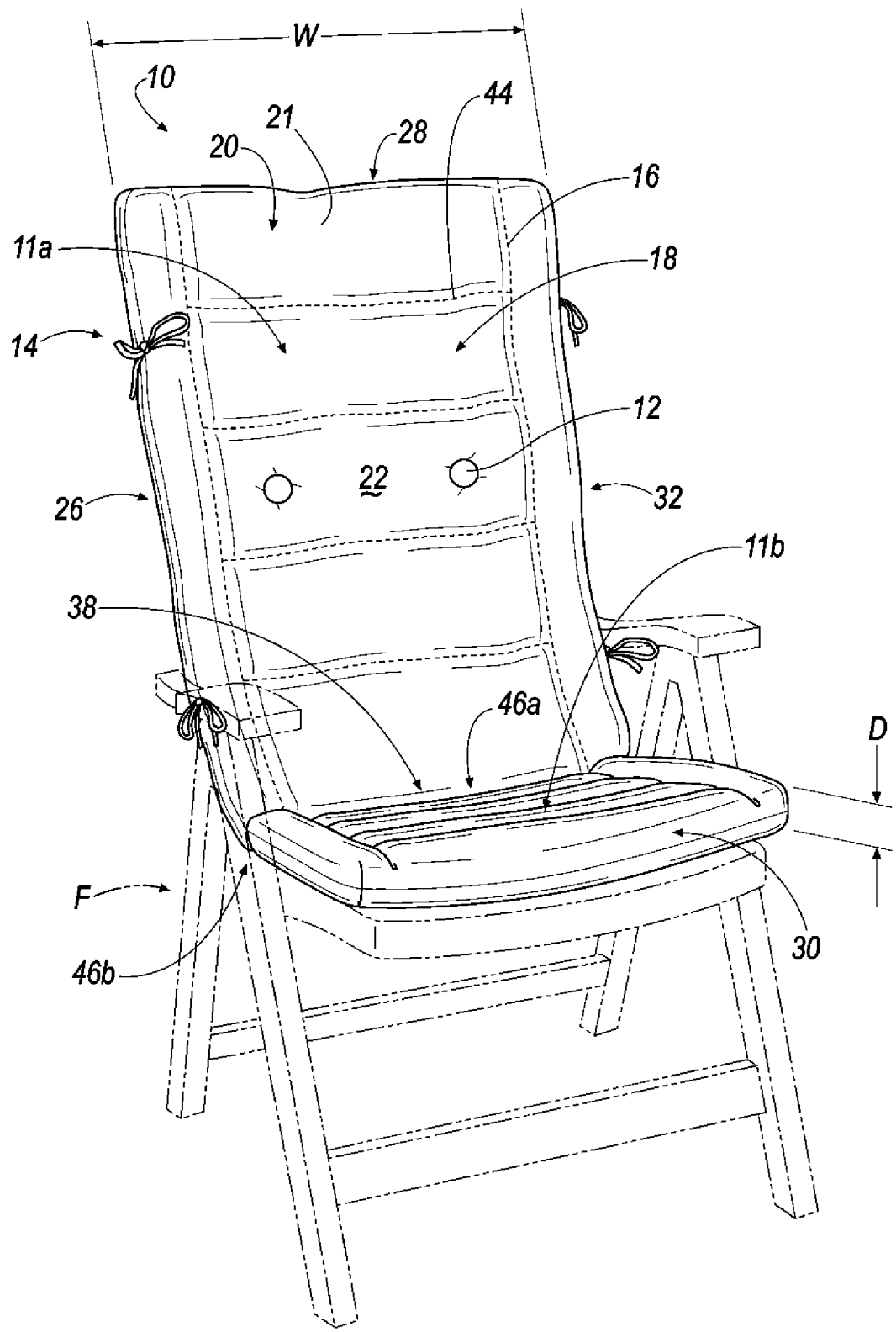
FIG. 1 is a perspective, environmental view of a cushion unit, in accordance with an exemplary embodiment of the invention, that is placed upon an article of furniture.

Referring to FIG. 1, a cushion unit is shown generally at 10 according to an embodiment. As illustrated, the cushion unit 10 is positioned for use on an article of furniture, F, such as, for example, a chair of a patio furniture set. Although the illustrated article of furniture, F, is a chair of a patio furniture set, it will be appreciated that the cushion unit 10 is not limited in size or shape for a particular article of furniture, F, such as, for example, a chair of a patio furniture set, and that the cushion unit 10 may be sized or shaped for application with any desirable article of furniture, F, including, but not limited to, a folding lawn chair, a deck chair, a chaise lounge chair, a couch, a loveseat, stool, bed, or the like. If desired, the cushion unit 10 may also include a variety of functional or decorative features, such as, for example, buttons 12, tie-down tassels 14, stitched patterns 16, 44 that define cushion segments 18, or the like.

Even further, it will be appreciated that the cushion unit 10 may be utilized as a stand-alone unit and may not necessarily be associated with an article of furniture, F. As such, the cushion unit 10, may be shaped for any desirable, stand-alone purpose or application, such as, for example, an elongated body pillow, canine bed, or the like.

Figure 2:
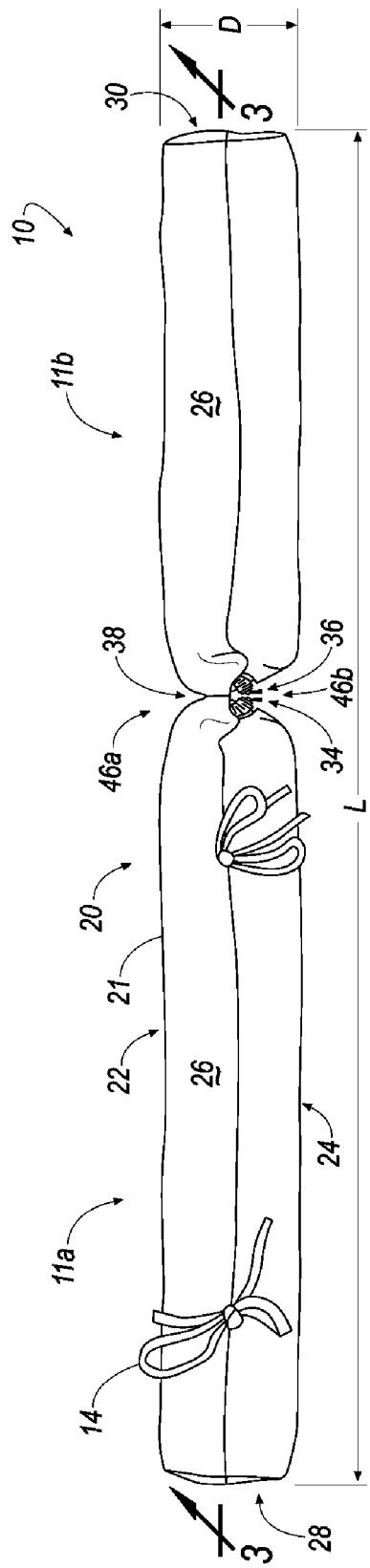
FIG. 2 is a side view of a cushion unit in accordance with an exemplary embodiment of the invention.

Referring to FIGS. 1 and 2, the cushion unit 10 is generally defined to include a shell 20, which may also be referred to as a "show surface" or "skin surface" of material. An outboard surface 21 of shell 20 may have any desirable color, texture, or decorative pattern and may include any desirable material including, for example, a fabric, polyester, or the like that is composed of natural fibers, synthetic fibers, or a blend of natural and synthetic fibers.

The shell 20 is defined to include a plurality of facets 22-32 that may be defined by any combination of a width, W (FIG. 1), a length, L (FIG. 2), or depth D (FIGS. 1 and 2). According to an embodiment, the facets identified at 22 and 24 may be referred to as a first face surface and a second face surface, respectively, whereas the facets identified at 26-32 are referred to as edge surfaces, respectively.

The first and second face surfaces 22, 24 are designed to include any desirable length, L, and width, W. If, for example, the cushion unit 10 is designed for application with a chair of a patio furniture set, F, the cushion unit 10 may be designed to include at least a back/lumbar support surface 11a and derriere/buttocks support surface 11b that is proportional to that of, for example, an average-sized adult, child, or the like.

According to an embodiment, as shown in FIG. 2, the first face surface 22 may further define the shell 20 to include a substantially uninterrupted, aesthetically-pleasing surface 46a proximate a hinge-seam 38 that may face away from the article of furniture, F (i.e., as shown in FIG. 1). According to an embodiment, the hinge-seam 38 may extend across the width, W, and generally separate the cushion unit 10 into the back/lumbar support portion 11a and the derriere/buttocks support portion 11b.

Referring to the opposite, second face surface 24, the cushion unit 10 may include one or more fasteners 34, 36. As illustrated, the one or more fasteners 34, 36 may be disposed along the width, W, proximate and along the hinge-seam 38 of the cushion unit 10. The one or more fasteners 34, 36 may include any desirable fastener, such as, for example, a zipper, a plurality of hooks and loops, such as, for example, VELCRO®, or the like. Because the one or more fasteners 34, 36 is/are disposed along the width, W, and hinge-seam 38, it will be appreciated that the one or more fasteners 34, 36 are not disposed on an edge surface facet 26-32, as commonly associated with the prior art. However, it will be appreciated that, if desired, one or more fasteners 34, 36 may be disposed on the edge surface facet 26-32.

Figure 3:
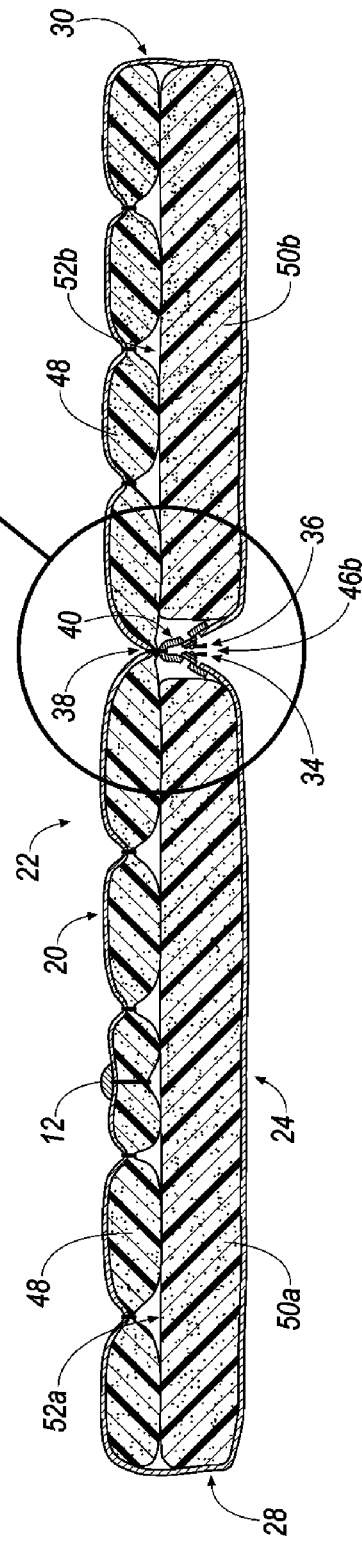
FIG. 3 is a cross-sectional view of the cushion unit of FIG. 2 according to line 3-3.
Figure 4A:
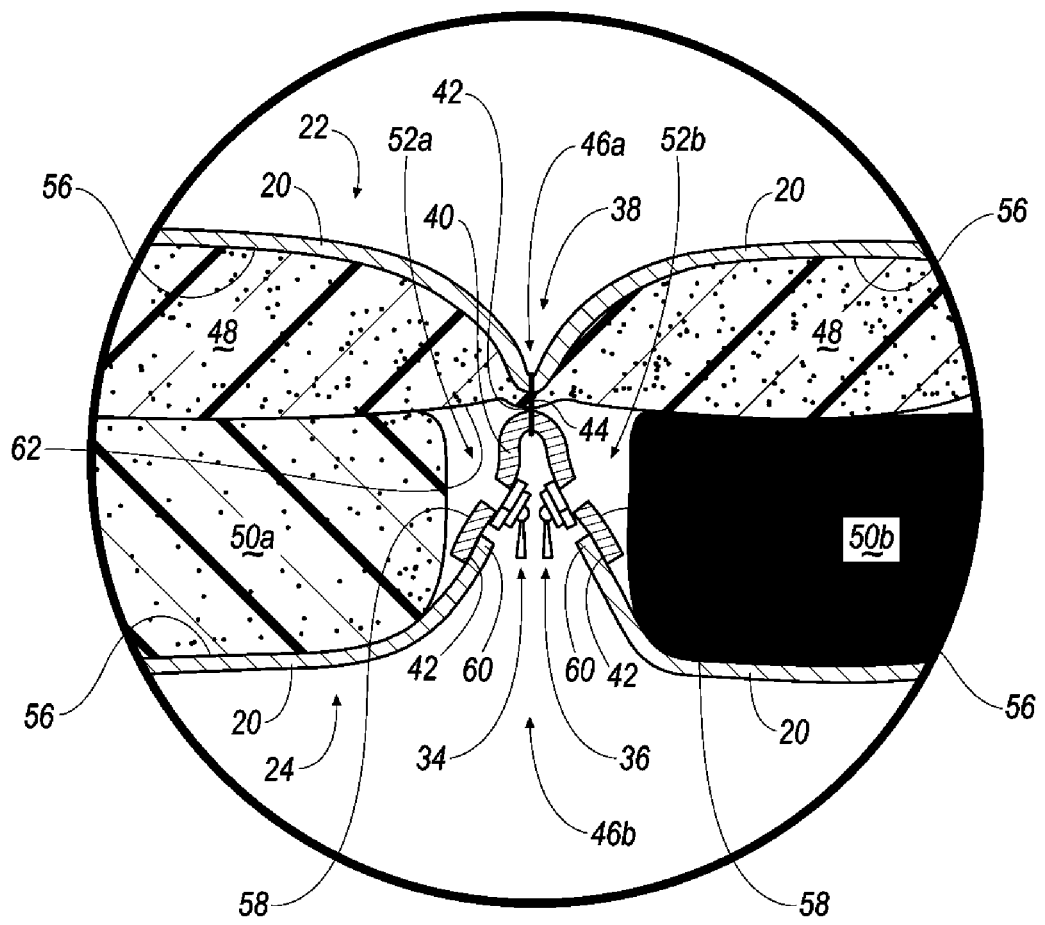
FIG. 4A is a magnified view of the cushion unit of FIG. 3 according to line 4 in accordance with an exemplary embodiment of the invention.
Figure 4B:
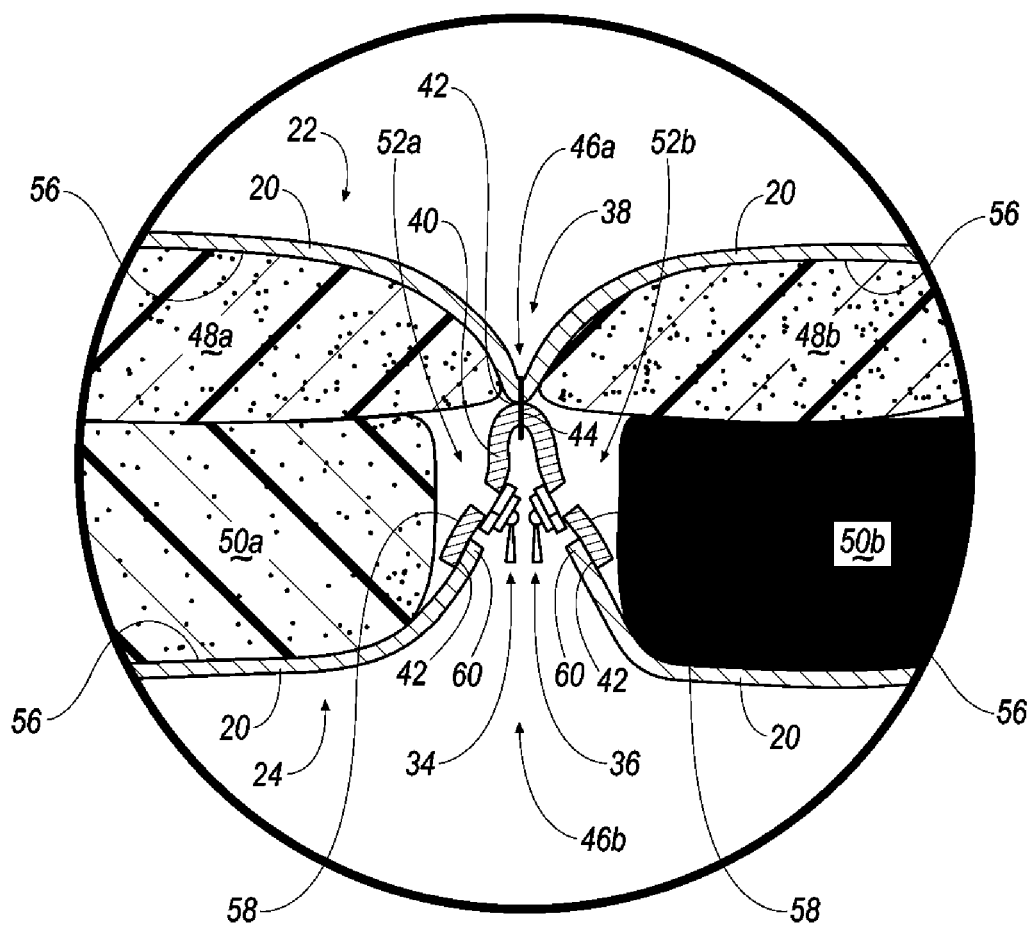
FIG. 4B is a magnified view of the cushion unit of FIG. 3 according to line 4 in accordance with an exemplary embodiment of the invention.

Referring to FIGS. 4A and 4B, a fastener portion may include a fastener support material 40 as well as the fasteners 34, 36. The fastener support material 40 may be secured to the shell 20 by way of an adhesive 42 and/or a stitched-threading 44. The fastener support material 40 may include any material, such as, for example, fabric, plastic, or the like. As also shown in FIGS. 3, 4A, and 4B, the one or more fasteners 34, 36 and fastener support material 40 are disposed proximate to and along a width, W, of the cushion unit 10 as well as being disposed proximate to and along the hinge-seam 38 to further define the second face surface 24 to include a substantially interrupted surface portion, which is shown generally at 46b.

Because the one or more fasteners 34, 36 provide the second face surface 24 with a substantially interrupted surface portion 46b that may not be aesthetically-pleasing to an observer, the second face surface 24 may positioned adjacent the article of furniture, F, so that the interrupted surface portion 46b is not in clear sight by an observer. Although the one or more fasteners 34, 36 are provided proximate to and along a width, W, of the cushion unit 10 proximate the hinge-seam 38 on the second face surface 24, it will be appreciated that the cushion unit 10 may be flipped such that the second face surface 24 may face away from the article of furniture, F, while the first face surface 22 is adjacent the article of furniture, F (i.e., the opposite positioning of the cushion unit 10 on the article of furniture, F, as shown in FIG. 1). According to an embodiment, the second face surface 24 may include a different texture, color, or pattern than that of the first face surface 22, and, as such, it may be desirable to change the appearance of the furniture assembly (i.e., the combination of the cushion unit 10 and article of furniture, F) by flipping the cushion unit 10 to expose the opposite of the first or second surface 22, 24 to an observer.

Referring to FIG. 3, the edge surfaces 26-32 are designed to include a length, L, width, W, and/or depth, D, that may accommodate the insertion of one or more cushion members 48, 50a, 50b into one or more cushion retaining portions 52a, 52b, respectively. According to an embodiment, the shell 20 may be defined to include a first cushion retaining portion, which is shown generally at 52a, and a second cushion retaining portion, which is shown generally at 52b that are demarcated by the hinge-seam 38. According to an embodiment, as shown in FIG. 4A, a first fastener, which is shown generally at 34, is disposed on the second face surface 24 and associated with selective access to the first cushion retaining portion 52a, whereas a second fastener, which is shown generally at 36, is disposed on the second face surface 24 and associated with selective access to the second cushion retaining portion 52b.

The first and second fasteners 34, 36 provide, respectively, an opening 54a, 54b (FIG. 5D) proximate the hinge-seam 38 and along the width, W, of the cushion unit 10. As such, it will be appreciated that the hinge-seam 38 may be further defined to substantially include the first and second fasteners 34, 36, thereby providing a "selectively-openable hinge-seam." Accordingly, the openings 54a, 54b may also be referred to as hinge-seam openings that provide selective access to a potential cushion-receiving volume, $V_R$ (FIG. 5C), or cavity of the first and second cushion retaining portions 52a, 52b.

Figure 5A:
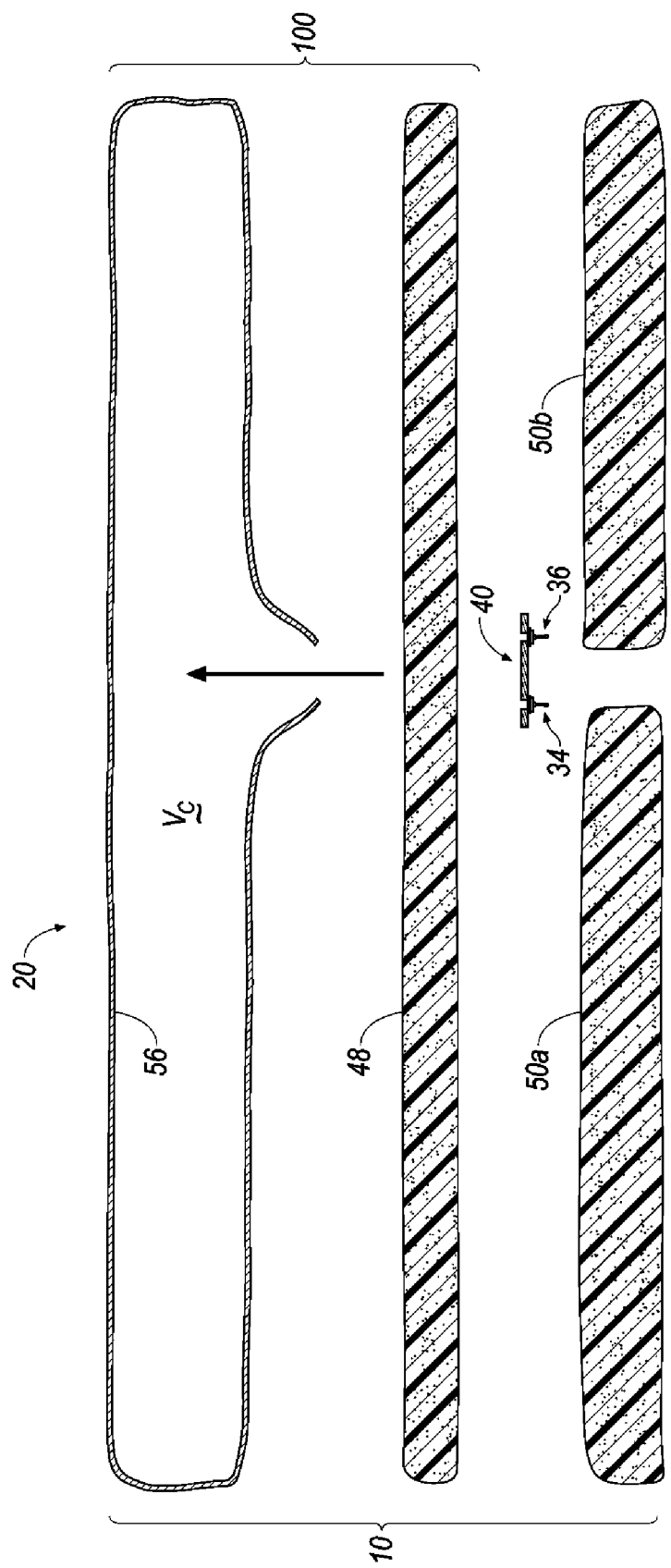
FIGS. 5A-5D illustrate a cross-section view of a method for manufacturing/assembling a cushion unit in accordance with an exemplary embodiment of the invention.
Figure 5B:
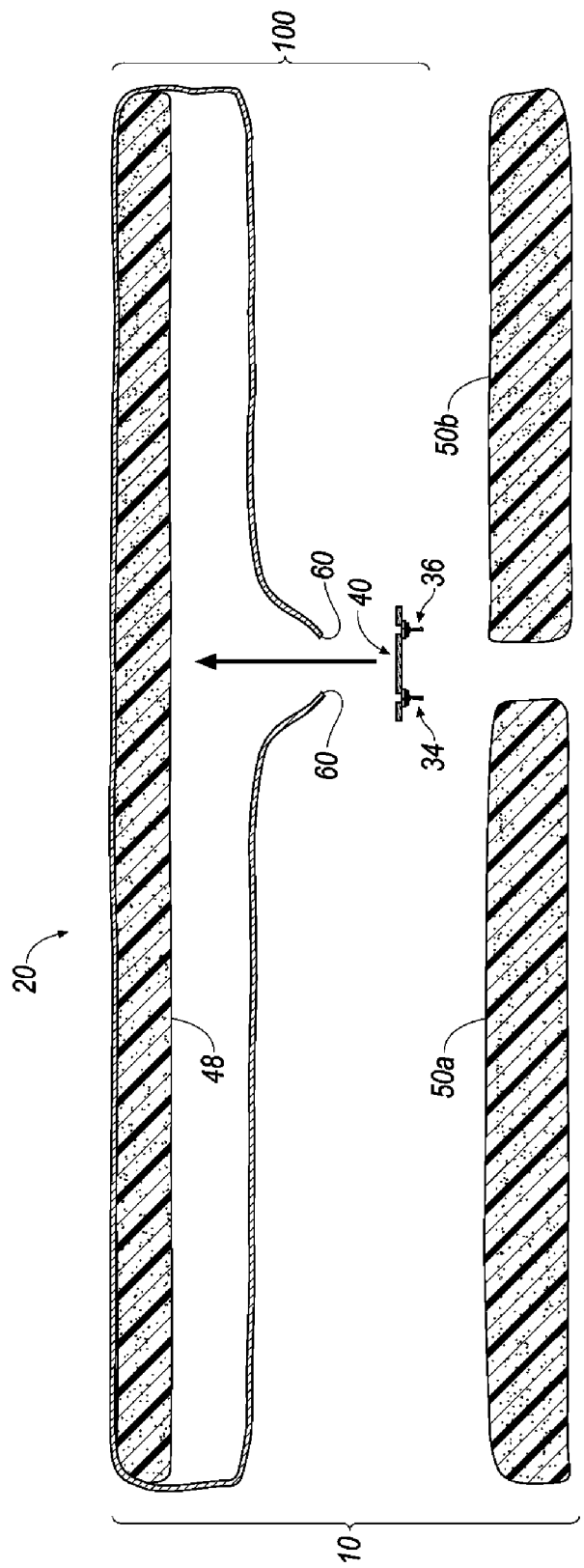
Figure 5C:
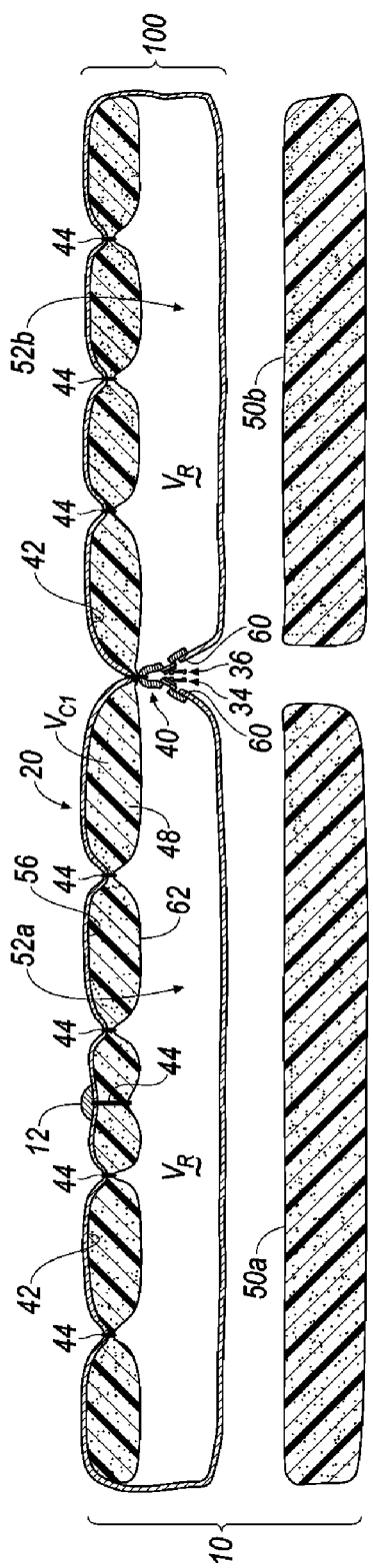
Figure 5D:
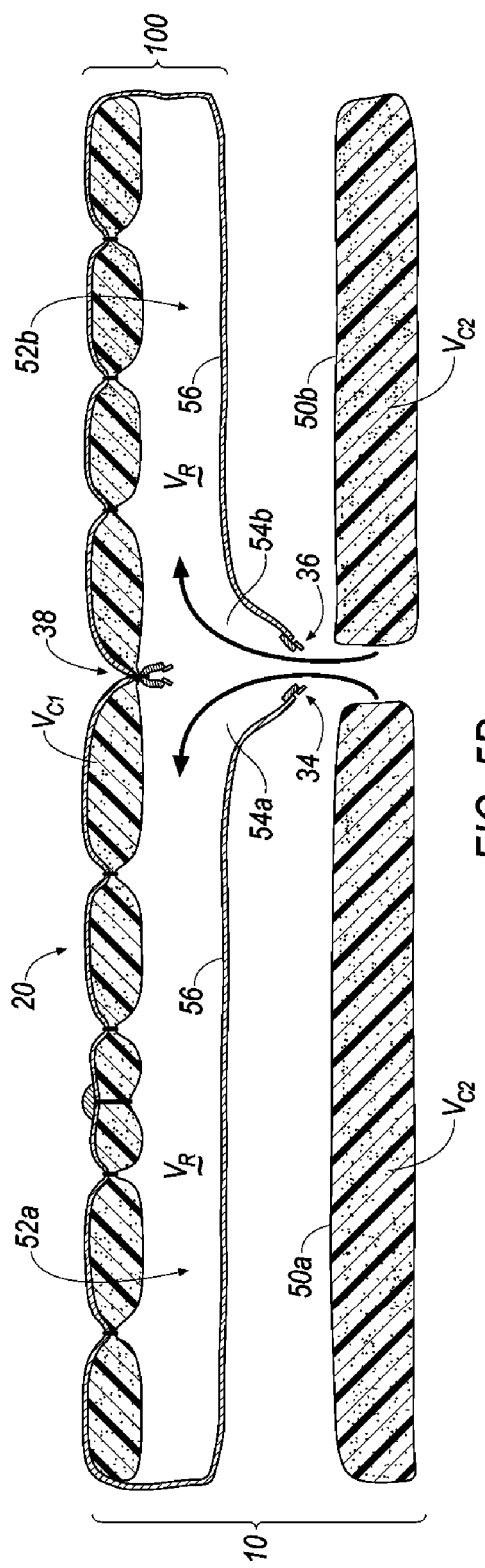

As shown in FIGS. 5C and 5D, the fasteners 34, 36 may be moved from a closed position (FIG. 5C) to an open position (FIG. 5D). Movement of the fasteners 34, 36 to/from the opened/closed positions provide selective access to the potential cushion-receiving volume, $V_R$, or cavity of the cushion retaining portions 52a, 52b. Once access is provided to the potential cushion-receiving volume, $V_R$, or cavity, an un/skilled laborer, cushion unit user, or the like may be permitted to removably-secure the one or more cushion members 50a, 50b within the cushion retaining portions 52, 52b.

Referring back to FIG. 4A, the material of the shell 20 is further defined by an inboard surface 56. Additionally, the fastener support material 40 also includes an inboard surface 58. In combination, the inboard surface 56 of the shell 20 and the inboard surface 58 of the fastener support material 40 generally define the limits of a cushion-receiving volume, $V_C$ (e.g., shown generally in FIG. 5A), or cavity for receiving a volume of material defined by a combination of a summation of a volume of the cushion members 48, 50a, 50b.

Referring now to FIGS. 5A-5D, a method for manufacturing the cushion unit 10 is shown according to an embodiment. Referring to FIG. 5A, the first step of the manufacturing process includes placing the cushion member 48 adjacent the inboard surface 56 of the shell 20. Then, as shown in FIG. 5B, the fastener support material 40 is attached to the cushion member 48 and at terminal ends 60 of the shell 20.

Referring to FIG. 5C, when the cushion member 48, shell 20, and fastener support material 40 are assembled as described above, a partially-assembled cushion unit 100 is provided. The partially-assembled cushion unit 100, in general, defines the cushion retaining portions 52a, 52b when the fastener support material 40 is attached to the cushion member 48 and at terminal ends 60 of the shell 20.

According to an embodiment, as seen in FIG. 4A, the fastener support material 40 may be attached to an outboard surface 62 of the cushion member 48 by way of any desirable method, such as, for example, with an adhesive 42, a stitched-threading 44, or the like. According to an embodiment, a stitched-threading 44 extends through the cushion member 48 so as to indirectly attach the fastener support material 40 to the inboard surface 56 of the shell 20 while being directly attached to the inboard surface 62 of the cushion member 48 proximate the hinge-seam 38.

According to an alternative embodiment, as seen in FIG. 4B, it will be appreciated that the cushion member 48 may be provided as two separate units, which are designated generally at 48a, 48b, such that the fastener support material 40 may not be attached to the outboard surface 62 of the cushion member 48 as shown in FIG. 4A. Thus, as shown in FIG. 4B, it will be appreciated that the fastener support material 40 may be directly attached to the inboard surface 56 of the shell 20 by way of an adhesive 42, stitched threading 44, or the like.

Before or after the fastener support material 40 is attached as described above proximate the hinge-seam 38, the outboard surface 62 of the cushion member 48 may also be affixed to the inboard surface 56 of the shell 20 by way of an adhesive 42 and/or a plurality of stitched-threadings 44, as shown in FIG. 5C. When attached with the plurality of stitched-threadings 44, a structural arrangement of the shell 20 and cushion member 48 is provided while also providing an aesthetic feature by defining a plurality of cushion segments 18, as shown in FIG. 1.

In this state, the first cushion member 48 may be further defined to include and define a volume, $V_{C1}$. As shown in FIG. 5C, when secured to the inboard surface 56 as described above, the volume, $V_{C1}$, of the first cushion member 48, reduces the available cushion-receiving volume in each cushion retaining portion 52a, 52b to the reduced cushion receiving volume, $V_R$, for receiving, respectively, the second cushion member 50a, 50b.

Referring to FIG. 5D, once the reduced cushion-receiving volume, $V_R$, is provided, a second cushion member, which is shown generally at 50a, 50b, that includes a volume, $V_{C2}$, is removably-secured within the reduced cushion-receiving volume, $V_R$ (i.e., $V_R$ should be approximately equal to $V_{C2}$). As shown in FIG. 5D, the second cushion members 50a, 50b are inserted through the opening 54a, 54b so as to occupy the cushion-receiving volume, $V_R$.

Once inserted through the opening 54a, 54b the fastener 34, 36 may be moved from an opened position (FIG. 5D) to a closed position (FIG. 5C) to selectively-close the opening 54a, 54b. Because each second cushion member 50a, 50b is not adhered, stitched, or otherwise permanently-secured to the inboard surface 56 of the shell 20 (i.e., as with the first cushion member 48), the second cushion member 50a, 50b may be removed or inserted into the reduced cushion-receiving volume, $V_R$, at any desirable time.

As such, it will be appreciated that the cushion-receiving volume, $V_C$, as shown in FIG. 5A, may be defined to include a volume that is substantially equal to the sum of the volumes, $V_{C1}$, $V_{C2}$, of the one or more cushion members 48 50a, 50b. Although the illustrated embodiment is described to include one cushion member 48 that is permanently-secured to the inboard surface 56 of the shell 20 and two cushion member 50a, 50b that are removably-secured within the shell 20, it will be appreciated that the cushion-receiving volume, $V_C$, may be designed to provide for any desirable number or combination of permanently-secured and/or removably-secured cushion members 48, 50a, 50b in the shell 20.

Thus, the cushion unit 10 provides an end-user with the ability to selectively control the cushioning effect of the cushion unit 10. For example, if an end-user chooses to reduce/increase the cushioning effect of the cushion unit 10, the end-user may move the fastener 34, 36 from a closed position (FIG. 5C) to an open position (FIG. 5D) so as to provide the end-user with the ability to selectively remove/insert one or more of the cushions 50a, 50b or supplemental cushioning articles (not shown) therein.

In addition, the structure of the cushion unit 10 provides an improvement over conventional cushion manufacturing/assembling techniques so as to maintain profitability or returns greater profits to a cushion manufacturer. According to an embodiment, as shown in FIGS. 6A and 6B, the manufacturer may selectively choose a manufacturing/assembling methodology that may maintain or increase profitability. According to an embodiment, profitability is maintained or increased by an amount of partially-assembled cushion units 100 (FIG. 6A) or cushion units 10 (FIG. 6B) that may be provided in a shipping container/crate 200a, 200b.

In a first embodiment, as seen in FIG. 6A, a manufacturer may choose to manufacture a plurality of partially-assembled cushion units 100 that may be shipped in a shipping container/crate 200a. Alternatively, as seen in FIG. 6B, a manufacturer may choose to manufacture a plurality of cushion units 10 that may be shipped in a shipping container/crate 200b. Comparatively, for purposes of discussion below, the shipping containers/crates 200a, 200b include a cavity 202 having an equal volume.

Figure 7:
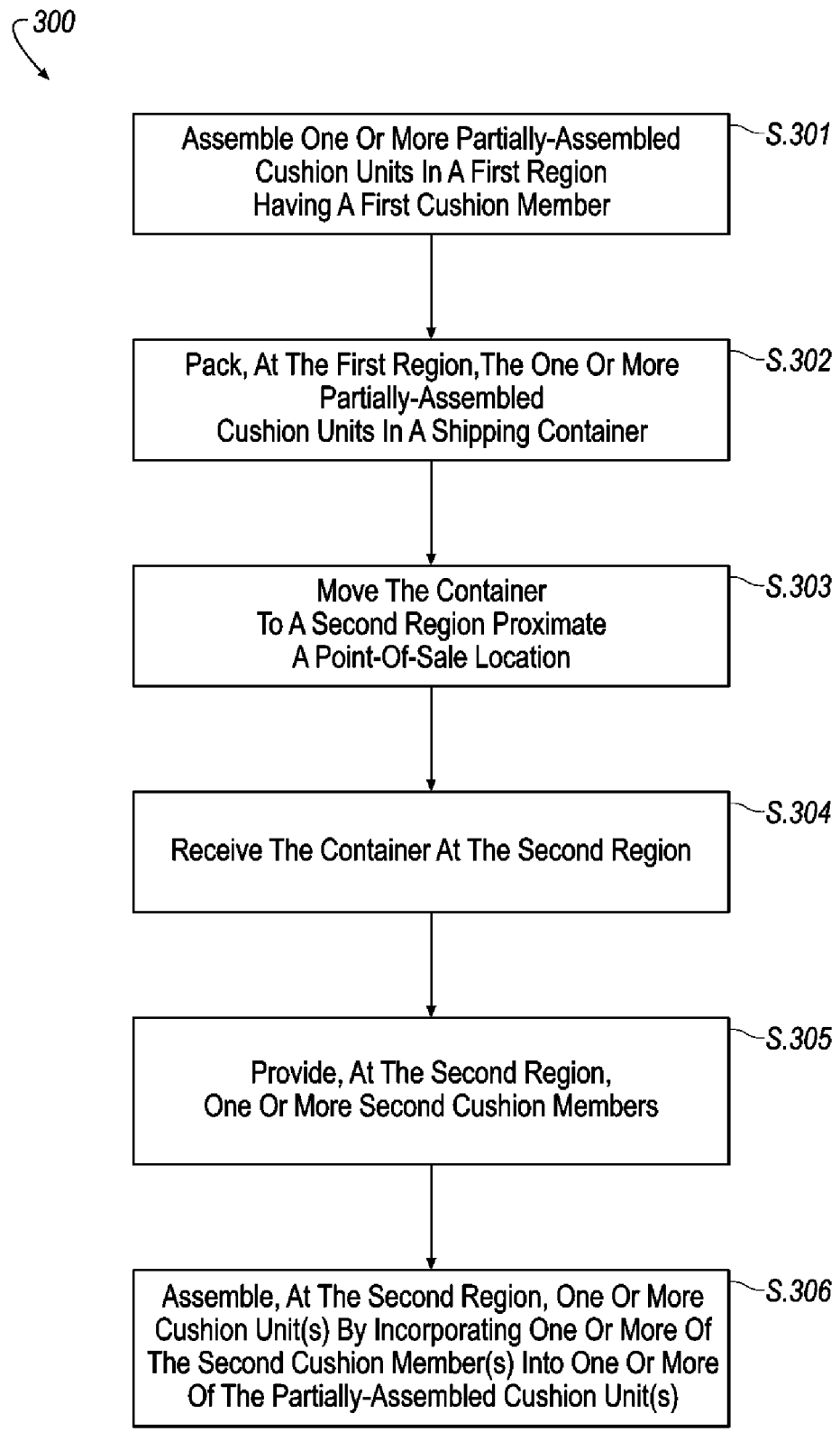
FIG. 7 illustrates a method for providing a cushion unit in accordance with an exemplary embodiment of the invention.

According to an embodiment, as shown in a method 300 illustrated in FIG. 7, the plurality partially-assembled cushion units 100 may be assembled, at step S.301, in a first location, which may have a significantly cheaper labor force than that of the point of sale location. Because the partially-assembled cushion units 100 have a reduced volume (i.e., approximately the volume, $V_{C1}$, of the first cushion 48), a greater amount of partially-assembled cushion units 100 may be packed, at step S.302, into the shipping crate 200a (i.e., as shown in FIG. 6A) in comparison to the cushion units 10 packed in the shipping crate 200b (i.e., as shown in FIG. 6B), due to the reduced volume of each partially-assembled cushion unit 100 (i.e., the absence of the volume, $V_{C2}$, of the second cushion members 50a, 50b that would otherwise occupy additional volume in the shipping crate 200a).

According to an embodiment, as shown in FIG. 6A, eight partially-assembled cushion units 100 are provided in the shipping crate 200a whereas four cushions 10 are provided in the shipping crate 200b, as shown in FIG. 6B. Thus, it will be appreciated that when a plurality of partially-assembled cushion units 100 are packed into a shipping crate 200a, the number of partially-assembled cushion units 100 may approximately double the number of cushions 10 packed into a similar shipping crate 200b.

After the crate 200a of partially-assembled cushion units 100 is moved and arrives at the second, point-of-sale location, at steps S.303, S.304, the second cushion members 50a, 50b may be provided, at step S.305 for insertion, at step S.306, as shown in FIG. 5D, by an unskilled laborer, so as to provide a fully assembled cushion unit 10. Alternatively, if desired, the removable cushion 50a, 50b may not be inserted into the shell 20 after the crate 200a arrives at the second, point-of-sale location at step S.306.

As such, the manufacturer may elect to remove the costs associated with stuffing the removable cushions 50a, 50b into the shell 20 by the unskilled laborer in the first region at step S.301 by shifting the task of the unskilled laborer in the first region to an unskilled laborer or customer of the cushion unit 10 in the second region. Thus, when the crate 200a arrives at the point-of-sale location (i.e., at the second national country remote from the first national country having the cheaper labor force), as shown in step S.304, another laborer (e.g., the unskilled laborer or customer) may conduct the task of inserting the removable cushion 50a, 50b into the shell 20, as shown in step S.306.

As such, the structure of the partially-assembled cushion unit 100 may maintain or increase the profitability of a cushion manufacturer by permitting the manufacturer to increase efficiency in the shipping step (i.e., steps S.303, S.304) by receiving a relatively large amount of partially-assembled cushion units 100 having already been processed by a skilled-laborer, less an unskilled labor step of incorporating a second cushion into the shell 20 so as to complete the assembling procedure at a later time at the second location by an unskilled laborer or customer. Thus, efficiency of a cushion manufacturing process is improved as related to the skilled-laborer manufacturing step, the shipping step, and the final unskilled laborer step by delaying any unskilled labor in the manufacturing of the cushion unit 10 until a partially-assembled cushion unit 100 arrives at a second location that is proximate the point-of-sale.

The present invention has been described with reference to certain exemplary embodiments thereof. However, it will be readily apparent to those skilled in the art that it is possible to embody the invention in specific forms other than those of the exemplary embodiments described above. This may be done without departing from the spirit of the invention. The exemplary embodiments are merely illustrative and should not be considered restrictive in any way. The scope of the invention is defined by the appended claims and their equivalents, rather than by the preceding description.

What is claimed is:

1. A cushion unit, comprising:
   a shell having a first cushion retaining portion and a second cushion retaining portion that are demarcated by
   a hinge-seam body that is affixed to the shell;
   a first cushion member that is non-removably affixed to an inboard surface of the shell and at least partially disposed in at least one of the first and second cushion retaining portions;
   a fastener portion included with the hinge-seam body, wherein the hinge seam body is affixed to the shell such that it directly contacts an outboard surface of the first cushion member, and
   indirectly to an inboard surface of the shell;
   a second cushion member removably-disposed in the first cushion retaining portion, and
   a third cushion member removably-disposed in the second cushion retaining portion, wherein at least one of the second and third cushion members are disposed at least partially adjacent the first cushion member that is non-removably affixed to the inboard surface of the shell.

2. A cushion unit, comprising:
   a shell having a first cushion retaining portion and a second cushion retaining portion that are demarcated by
   a hinge-seam body that is affixed to the shell;
   one or more first cushion member units that is/are non-removably affixed to an inboard surface of the shell and disposed
   proximate the hinge-seam body and
   in at least one of the first and second cushion retaining portions; and
   a fastener portion-included with the hinge seam body, wherein the hinge seam body is affixed
   directly to an inboard surface of the shell;
   a second cushion member removably-disposed in the first cushion retaining portion, and
   a third cushion member removably-disposed in the second cushion retaining portion, wherein at least one of the second and third cushion members are disposed at least partially adjacent the one or more first cushion member units that is/are non-removably affixed to the inboard surface of the shell.

3. A method for providing a cushion unit, wherein prior to the receiving step, the method further comprises the steps of:
   assembling one or more partially-assembled cushion units in a first location;
   providing the one or more partially-assembled cushion units in a container;
   moving the container from the first location to a second location;
   wherein the receiving step further comprises the step of receiving the container at the second location;
   wherein the removably-securing step further comprises the steps of providing one or more cushion unit components at the second location and assembling one or more cushion units at the second location by incorporating the one or more cushion components with one or more of the one or more partially-assembled cushion units that were moved in the container.

4. The method according to claim 3, wherein the assembling a plurality of partially-assembled cushion units in a first location step includes the steps of
   providing the shell of material,
   affixing the first cushion member to the inboard surface of the shell of material, and
   affixing the fastener portion to the shell of material and cushion member to provide a partially-assembled cushion unit that defines the one or more cushion retaining portions upon affixing the fastener portion to one or more of the shell of material and cushion member.

5. The method according to claim 3, wherein the one or more cushion unit components include one or more second cushion members, wherein the assembling one or more cushion units at the second location step includes removably-securing the one or more second cushion members in the one or more cushion retaining portions.

6. A cushion unit, comprising:
   a shell having an outboard surface and an inboard surface, wherein the outboard surface of the shell forms an outer surface of the cushion unit, wherein the inboard surface of the shell forms a cushion-receiving volume for the cushion unit;
   a hinge seam body connected to the inboard surface of the shell, wherein the hinge seam body includes
   a fastener portion, wherein the connection of the hinge seam body to the inboard surface of the shell results in the cushion-receiving volume being partitioned to form
   a first cushion-receiving sub-volume forming a first cushion retaining portion, and
   a second cushion-receiving sub-volume forming a second cushion retaining portion, wherein the first cushion-receiving sub-volume and the second cushion-receiving sub-volume are demarcated by the connection of the hinge-seam body to the inboard surface of the shell;
   a first cushion member that is disposed within a portion of the cushion-receiving volume;
   a second cushion member that is disposed within the first cushion-receiving sub-volume; and
   a third cushion member that is disposed within the second cushion-receiving sub-volume, wherein the first cushion member is non-removably secured to the inboard surface of the shell, wherein the second cushion member is removably-secured within the first cushion retaining portion of the shell, wherein the third cushion member is removably-secured within the second cushion retaining portion of the shell.

7. The cushion unit according to claim 6, wherein the first cushion member is disposed between the inboard surface of the shell and an inboard surface of the hinge seam body.

8. The cushion unit according to claim 7, wherein the hinge seam body is affixed
   directly to an outboard surface of the first cushion member, and
   indirectly to the inboard surface of the shell.

9. The cushion unit according to claim 6, wherein the hinge seam body is affixed
   directly to the inboard surface of the shell.

10. A method for manufacturing a cushion unit, comprising the steps of:
    receiving a shell of material including a permanently-affixed first cushion member adjacent an inboard surface of the shell of material, wherein a fastener portion is affixed to the shell of material to define one or more cushion retaining portions; and
    removably-securing one or more second cushion members in the one or more cushion retaining portions.

* * * * *